(12) United States Patent
Dehm et al.

(10) Patent No.: US 6,664,158 B2
(45) Date of Patent: Dec. 16, 2003

(54) FERROELECTRIC MEMORY CONFIGURATION AND A METHOD FOR PRODUCING THE CONFIGURATION

(75) Inventors: Christine Dehm, Nürnberg (DE); Heinz Hönigschmid, Essex Jct., VT (US); Thomas Röhr, Yokohama (JP)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/034,931

(22) Filed: Nov. 21, 2001

(65) Prior Publication Data
US 2002/0123203 A1 Sep. 5, 2002

(30) Foreign Application Priority Data
Nov. 22, 2000 (DE) .......................... 100 57 806

(51) Int. Cl.⁷ .......................... H01L 21/8242
(52) U.S. Cl. ...................................... 438/239
(58) Field of Search .................. 438/239, 241, 438/253

(56) References Cited

U.S. PATENT DOCUMENTS 6,198,652 B1   3/2001  Kawakubo et al. ......... 365/145
6,366,488 B1 * 4/2002  Zambrano et al. ......... 365/145

OTHER PUBLICATIONS

"High Density Chain Ferroelectric Random Access Memory (Chain FRAM)" (Takashima et al.), IEEE Journal of Solid State Circuits, vol. 33, No. 5, May 1998.

* cited by examiner

Primary Examiner—David Nelms
Assistant Examiner—Quoc Hoang
(74) Attorney, Agent, or Firm—Laurence A. Greenberg; Werner H. Stemer; Gregory L. Mayback

(57) ABSTRACT

An integrated ferroelectric memory configuration and a method for producing the integrated ferroelectric memory configuration, in which memory cells are arranged using the stacking principle, and both capacitor electrodes, which are located one above the other, of each memory cell are directly electrically connected by means of contact plugs to corresponding source and drain regions of an associated selection transistor in the substrate. Contact plugs for the contact connection to the upper capacitor electrodes are produced from above the configuration.

3 Claims, 4 Drawing Sheets

FIG. 3 (St. d. T.)
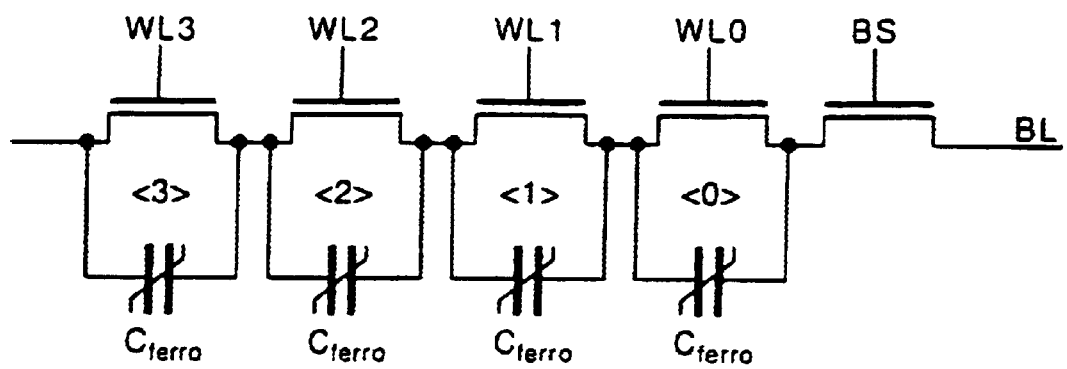
FIG. 4A (St. d. T.)
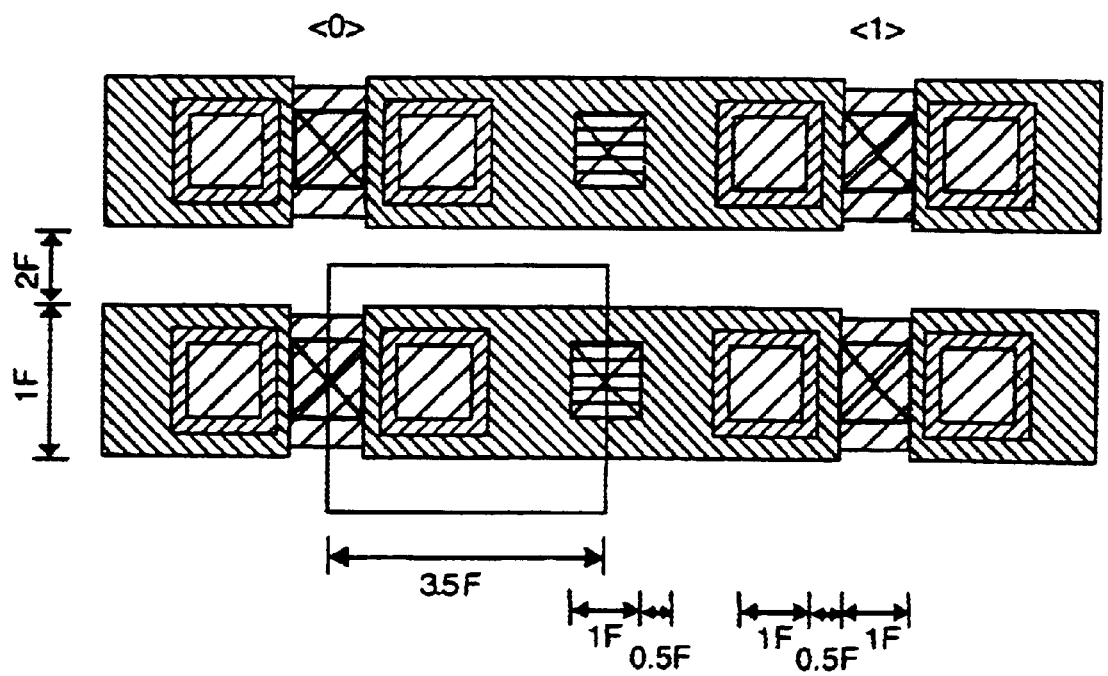

US 6,664,158 B2

FERROELECTRIC MEMORY CONFIGURATION AND A METHOD FOR PRODUCING THE CONFIGURATION

This application is a Divisional Application of U.S. patent application Ser. No. 09/194,786 filed Apr. 6, 1999, issued on Jun. 4, 2002 as U.S. Pat. No. 6,398,647, which is a 371 of PCT/JP98/01545 filed Apr. 3, 1998, incorporated herein by reference.

BACKGROUND OF THE INVENTION

Field of the Invention

The invention relates to an integrated ferroelectric memory configuration and to a method for producing the configuration, in which the memory cells are arranged using the stacking principle and in which both of the capacitor electrodes, which are located one above the other, of each memory cell are directly connected to the corresponding source and drain region of the associated selection transistor in the substrate by contact plugs.

A specific configuration of memory cells for ferroelectric memories has been proposed by D. Takashima et al. in a specialist report: "High-Density Chain Ferroelectric Random Access Memory (Chain FRAM)" in IEEE Journal of Solid State Circuits, Volume 33, No. 5, May 1998, page 787, and in a further specialist report "A sub-40 ns Random Access Chain FRAM Architecture with a 7 ns Cell-Plate-Line Drive" in IEEE International Solid-State Circuits Conference, 1999.

When using stacking cells, both capacitor electrodes are connected directly to the corresponding source/drain regions of the associated selection transistor in the substrate. This configuration of stacking cells is highly space-saving, in contrast to offset cells, in which the capacitor is located alongside, and not above, the transistor, and the capacitor electrodes must each be connected via a metal layer.

In chain FRAMs, since the memory cells are arranged not only between the lower electrode and the substrate but also between the upper electrode and the substrate, electrical contacts must be produced in the form of contact plugs. Since these two contact plugs have to produce contact connections for different electrode layers, they cannot be produced in the same process step. In particular, the contact plug for the upper electrode is problematic, since the insulating memory dielectric is located under that electrode. This dielectric must be removed for electrical contact, which involves lithography directly on the dielectric. However, in general, this should be avoided since, in consequence, the interface between the dielectric and the upper electrode can be contaminated, and this degrades the electrical characteristics of the capacitor.

FIG. 3 shows a circuit configuration in the form of a chain FRAM including four memory cells <0>, <1>, <2> and <3>. Each memory cell includes a ferroelectric capacitor $C_{ferro}$ and a selection transistor connected in parallel with it. The gate electrode of each selection transistor is connected to a respective word line WL0-WL3. Such a chain is selected by means of a common block select transistor using a selection signal BS. The drain or source area of the block select transistor is connected to the bit line BL. It is, of course, also possible to interconnect a different number of cells, for example 2, 8, 16 or 32 FRAM cells, to form a chain.

FIG. 4a is a schematic planar view and FIGS. 4b-4d are cross-sectional views illustrating how the contact plugs would be produced using conventional methods.

FIG. 4c shows the layer structure with planar capacitors, with the upper electrode plates being annotated by the reference number 2, the lower electrode plates by 4 and the dielectric by 3. The cross-sectional illustration shown in FIG. 4d shows the construction with capacitors having a three-dimensional lower electrode. The lower electrode includes an electrode strip 4s and stud-like projections 4. The dielectric 3 covers the electrode strip 4s and the stud-like projections 4, while the upper electrode plate 2, which is three-dimensional, covers the stud-like projection 4 on the lower capacitor electrode.

FIGS. 4a and 4b show a planar plan view and a cross sectional view, respectively, of a chain of two FRAM memory cells <0> and <1> with three-dimensional capacitors constructed as the capacitor shown in FIG. 4d. During the production of such a memory cell chain, first the contact plugs 5 for the lower electrode, that is to say for the electrode strip 4s, are etched and filled; the lower electrode, including the electrode strip 4s and the stud-like projection 4 are then deposited, with the contact plugs 5 allowing electrical contact with the substrate, that is to say with the source or drain area of the selection transistor. The dielectric 3 is then deposited over the lower capacitor 4, 4s, and this dielectric 3 must be removed in the area of the later produced contact plugs 6 for the upper electrode 2 (see the insulating areas 9). Lithography performed directly on the dielectric 3 is required to remove the dielectric 3. The upper capacitor electrode 2 is then deposited, with the electrical contact being produced by the contact plug 6 for the substrate, that is to say for the source or drain area of the associated selection transistor. FIG. 4a also shows that the plan area occupied by one memory cell, for example <0>, is 10.5 $F^2$=3 F×3.5 F. In this case, F indicates the minimum feature size. In FIG. 4b, the word lines WL are denoted by the reference number 7.

Thus, in order to produce the contact plug 6 for the upper capacitor electrode 2, the lower electrode, that is to say the electrode strip 4s thereof, and the dielectric must be removed in the areas, denoted by 9, around the contact plug 6, so that the subsequently deposited upper electrode 2 makes good electrical contact with the plug 6. As mentioned, this is disadvantageous, since the boundary area between the dielectric and the upper electrode can be contaminated.

SUMMARY OF THE INVENTION

It is accordingly an object of the invention to provide an integrated ferroelectric memory configuration and a method for producing the integrated ferroelectric memory configuration which overcome the above-mentioned disadvantages of the prior art apparatus and methods of this general type. In particular, it is an object of the invention to provide an integrated ferroelectric memory configuration such that there is no need to structure the dielectric before deposition of the upper capacitor electrode.

With the foregoing and other objects in view there is provided, in accordance with the invention, a method for producing an integrated ferroelectric memory configuration, that includes steps of: configuring memory cells using a stacking principle; for each one of the memory cells, providing a capacitor having two capacitor electrodes that are located one above another and providing an associated selection transistor that is located in a substrate; for each one of the memory cells, using contact plugs to directly electrically connect the two capacitor electrodes to a source region and a drain region of the associated selection transistor; producing given ones of the contact plugs from above; and providing each of the given ones of the contact plugs for contact connecting an upper one of the capacitor electrodes of the capacitor of at least one of the memory cells.

In accordance with an added mode of the invention, the method includes: in a first step, for the capacitor of each one of the memory cells, first producing one of the contact plugs for a lower one of the capacitor electrodes and then producing a dielectric; in a second step, for the capacitor of each one of the memory cells, etching a contact hole from above, through the upper one of the capacitor electrodes and at least through the dielectric as far as a substrate area of the associated selection transistor; the contact hole being for one of the given ones of the contact plugs for contact connecting an upper one of the capacitor electrodes; and in a third step, for the capacitor of each one of the memory cells, producing the one of the given ones of the contact plugs from above by filling the contact hole with a highly conductive metallic material to form an electrically conductive connection between the upper one of the capacitor electrodes and the substrate area of the associated selection transistor.

In accordance with an additional mode of the invention, the method includes: in the second step, also etching the contact hole through the lower capacitor electrode; and in the third step, before the contact hole is filled with the metallic material, forming an insulating spacing layer on a wall of the contact hole at least around an exposed area of the lower one of the capacitor electrodes to insulate the lower one of the capacitor electrodes from the one of the given ones of the contact plugs.

In accordance with another mode of the invention, the method includes, in the first step, for the capacitor of each one of the memory cells, forming the upper one of the capacitor electrodes and the dielectric to overlap the lower one of the capacitor electrodes in the contact hole such that the dielectric provides electrical insulation between the upper one of the capacitor electrodes and the lower one of the capacitor capacitor electrodes.

With the foregoing and other objects in view there is provided, in accordance with the invention, an integrated ferroelectric memory configuration, that includes: a substrate having selection transistors, each one of the selection transistors having a source region and a drain region; memory cells configured using a stacking principle, each one of the memory cells including a capacitor with a dielectric, an upper capacitor electrode, and a lower capacitor electrode located below the upper capacitor electrode; and contact plugs directly connecting each one of the memory cells to the source region and the drain region of an associated one of the selection transistors. The contact plugs include a first type of a contact plug for electrically connecting the upper capacitor electrode to a region selected from the group consisting of the drain region of the associated one of the selection transistors and the source region of the associated one of the selection transistors. The first type of contact plug produces contact with the upper capacitor electrode from above by passing through the upper capacitor electrode and the dielectric as far as the region selected from the group consisting of the drain region of the associated one of the selection transistors and the source region of the associated one of the selection transistors.

In accordance with an added feature of the invention, the first type of the contact plug passes through the lower capacitor electrode.

In accordance with an additional feature of the invention, the capacitor of each one of the memory cells is a planar memory capacitor; and the dielectric, the upper capacitor electrode, and the lower capacitor electrode lie in parallel planes.

In accordance with another feature of the invention, each one of the memory cells has a plan area of 10.5 $F^2$; and F is a minimum pattern size.

In accordance with a further feature of the invention, the capacitor of each of the memory cells is a three-dimensional capacitor; the lower capacitor electrode forms a stud-like projection; and the dielectric and the upper capacitor electrode cover the stud-like projection.

In accordance with a further added feature of the invention, there is provided, an insulating spacer layer. The lower capacitor electrode has an exposed region adjacent the contact plug. The first type of the contact plug passes through the lower capacitor electrode and is insulated from the exposed region of the lower capacitor electrode by the insulating spacer layer. The insulating spacer layer covers at least the exposed region of the lower capacitor electrode.

In accordance with a further additional feature of the invention, each one of the memory cells has a plan area of 9 $F^2$; and F is a minimum pattern size.

In accordance with yet an added feature of the invention, the upper capacitor electrode and the dielectric overlaps the lower capacitor electrode near the contact plug such that the dielectric provides electrical insulation between the upper capacitor electrode and the lower capacitor electrode.

According to one major aspect, the method according to the invention is characterized in that the contact plugs for the upper capacitor electrodes of each memory cell are not produced from underneath, but from above.

In the production process, the capacitor, including two capacitor electrodes and the dielectric, is produced first in a first step. In a second step, a contact hole is etched through the upper capacitor electrode and the dielectric, and possibly also through the lower capacitor electrode as far as the substrate area of the associated selection transistor. The contact hole is for a contact plug for the upper capacitor electrode. Then, in a third step, this contact plug is produced by filling the etched contact hole with a highly conductive material and producing a conductive connection between the upper capacitor electrode and the respective substrate area. This avoids direct structuring of the dielectric before deposition of the upper electrode.

The method simplifies the production process by producing the contact plug for the upper electrode of the memory capacitor from above. The cell area can be reduced in size by means of self-adjusting etching of the contact hole, as is proposed in one advantageous embodiment of the method according to the invention.

Other features which are considered as characteristic for the invention are set forth in the appended claims.

Although the invention is illustrated and described herein as embodied in a ferroelectric memory configuration, and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 shows a prior art FRAM chain including four ferroelectric memory cells configured in the stack; and FIGS. 4a, 4b, 4c and 4d illustrate a prior art method for producing an integrated ferroelectric memory configuration.

DESCRIPTION OF THE PREFERRED EMBODIMENTS

Figure 1A:
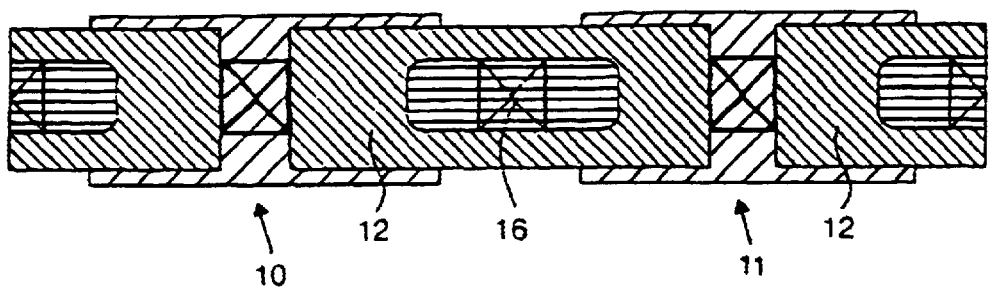
FIG. 1a shows a plan view of a first embodiment of a chain of ferroelectric memory cells.
Figure 1B:
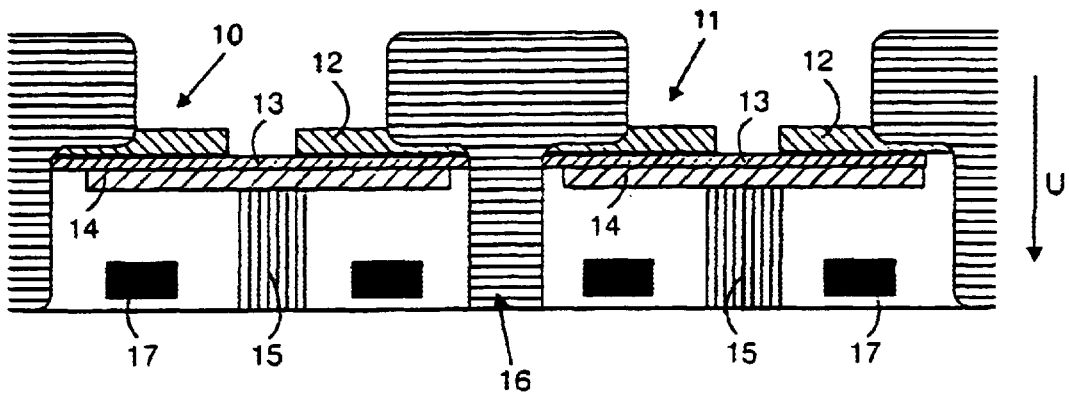
FIG. 1b shows a cross sectional view of the first embodiment of the chain of the ferroelectric memory cells.

Referring now to the figures of the drawing in detail and first, particularly, to FIG. 1a thereof, there is shown a plan view of a first embodiment of a chain of ferroelectric memory cells 10 and 11 with planar capacitors. FIG. 1b shows a cross sectional view of the ferroelectric memory cells 10 and 11 with the planar capacitors which, in this exemplary embodiment, include a planar upper capacitor electrode 12, a planar dielectric layer 13 and a planar lower capacitor electrode 14. The lower capacitor electrode 14 is connected by means of a contact plug 15 to a substrate area, that is to say to a drain or source area of an associated (not shown) selection transistor. This means that, during the production process, as in the prior art, the contact plug 15 for the lower capacitor electrode 14 is produced first of all, and the entire capacitor, including the lower electrode 14, the dielectric layer 13 and the upper electrode 12, is then produced, in this sequence. There is no need to structure the dielectric layer 13 before deposition of the upper electrode 12.

According to the invention, the contact plug 16 from the upper electrode 12 to the associated substrate area is produced downward from above, by etching through the upper electrode 12 and through the dielectric 13 as far as the substrate. The contact hole produced in this way is filled with a contact material, which makes contact with the upper capacitor electrode 12 from above and from the side, but not from below (see arrow U, which indicates the downward direction). If required, the contact material of the contact plug 16 can be planarized by means of CMP (Chemical Mechanical Polishing), as shown in FIG. 1d. The word lines are denoted by the reference number 17.

Figure 1C:
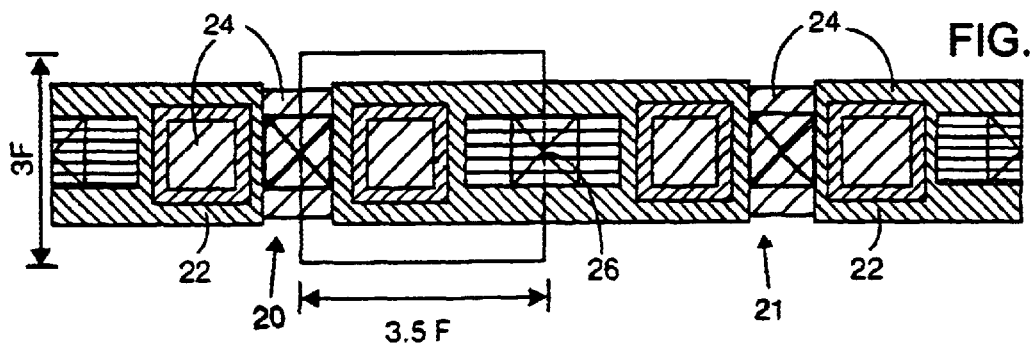
FIG. 1c shows a plan view of a second embodiment of a chain of ferroelectric memory cells.
Figure 1D:
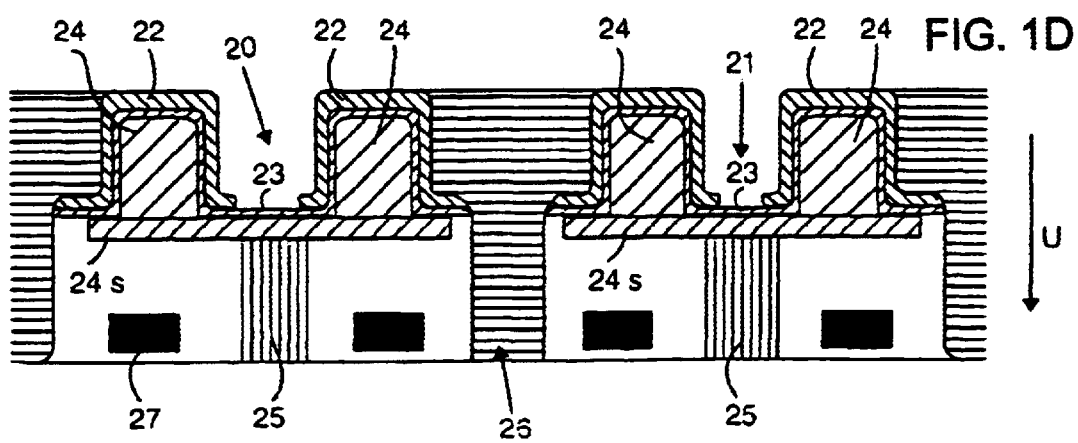
FIG. 1d shows a cross sectional view of the second embodiment of the chain of the ferroelectric memory cells.

FIG. 1c shows a plan view of a second embodiment of a chain of ferroelectric memory cells with three-dimensional capacitors, and FIG. 1d shows a cross-sectional view. In the second embodiment, the method steps carried out for production are the same as those which have just been described with reference to FIGS. 1a and 1b. Each one of the three-dimensional capacitors has a lower electrode 24s, 24 which itself includes a lower electrode strip 24s and a stud-like projection 24. The dielectric 23 covers the lower electrode strip 24 and the stud-like projections 24 from above, and the upper capacitor electrode 22 is located in a three-dimensional form above the dielectric 23, where it covers the stud-like projections 24. During the production of the ferroelectric memory cells 20 and 21 shown in FIGS. 1c and 1d, the contact plug 25 for the electrode strip 24s of the lower capacitor electrode is produced first, followed by the entire capacitor, after which, a contact hole is etched from above through the upper electrode layer 22, the dielectric layer 23, and possibly, through the lower electrode strip 24s. This contact hole is then filled with a highly conductive material, forming a contact plug 26 for the upper capacitor electrode 22. The word lines are denoted by 27 in FIG. 1d.

In the two exemplary embodiments shown in FIGS. 1a-d, the distance between the respective lower electrode 14 or 24S and the contact plug for the respective upper electrode 12 or 22 is assumed to be sufficiently large (typically 0.5 F, that is to say 0.5×minimum feature size) such that the contact hole can be adjusted without any problems. In FIG. 1c, the minimum plan area of the memory cell is 10.5 F²=3 F×3.5 F, as in the prior art.

Figure 2A:
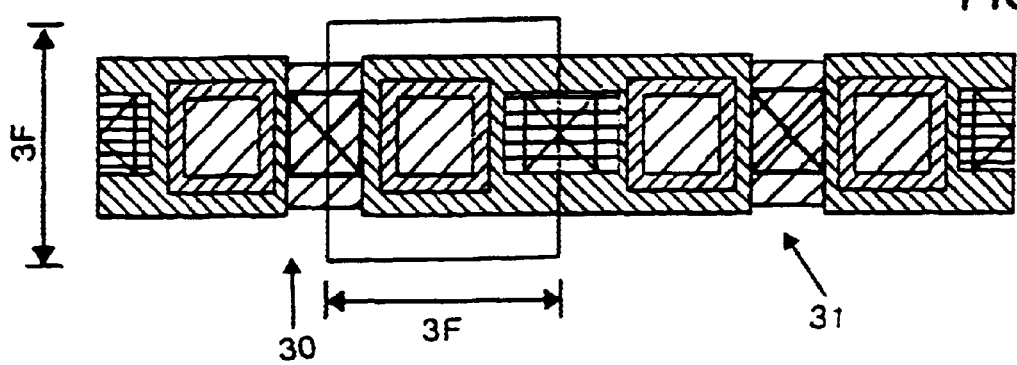
FIG. 2a shows a plan view of a third embodiment of a chain of ferroelectric memory cells.
Figure 2B:
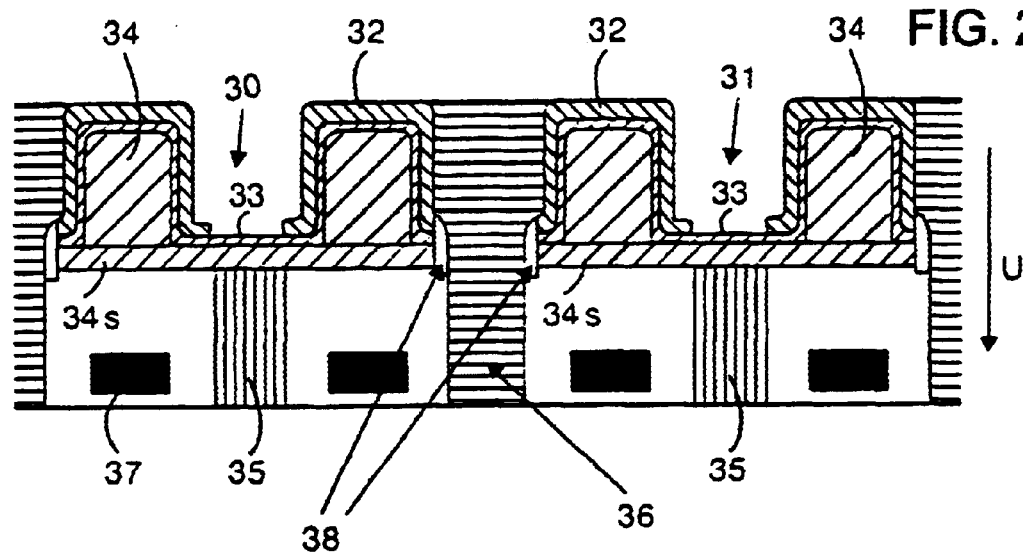
FIG. 2b shows a cross-sectional view of a third embodiment of a chain of ferroelectric memory cells.
Figure 2C:
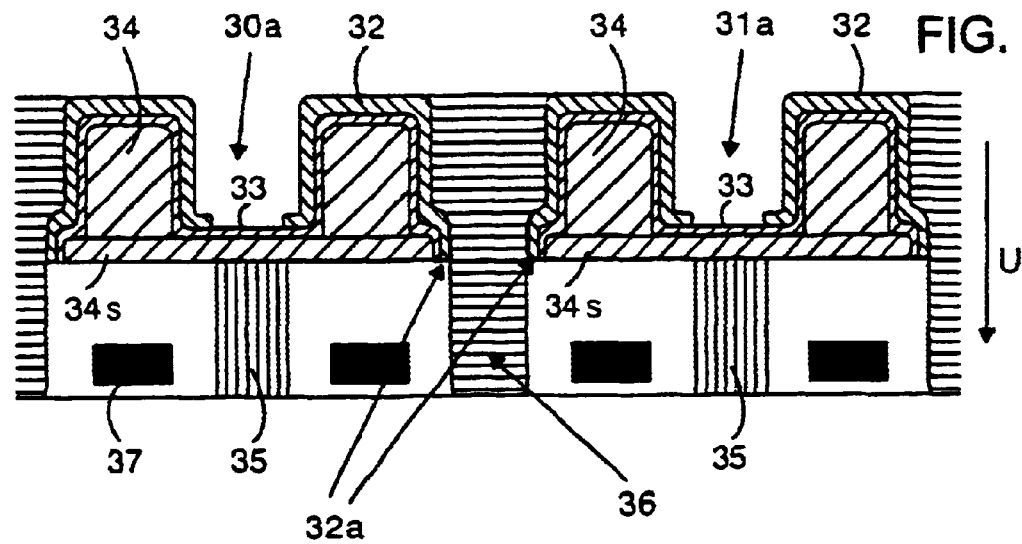
FIG. 2c shows a cross-sectional view of a fourth embodiment of a chain of ferroelectric memory cells.
Figure 4B:
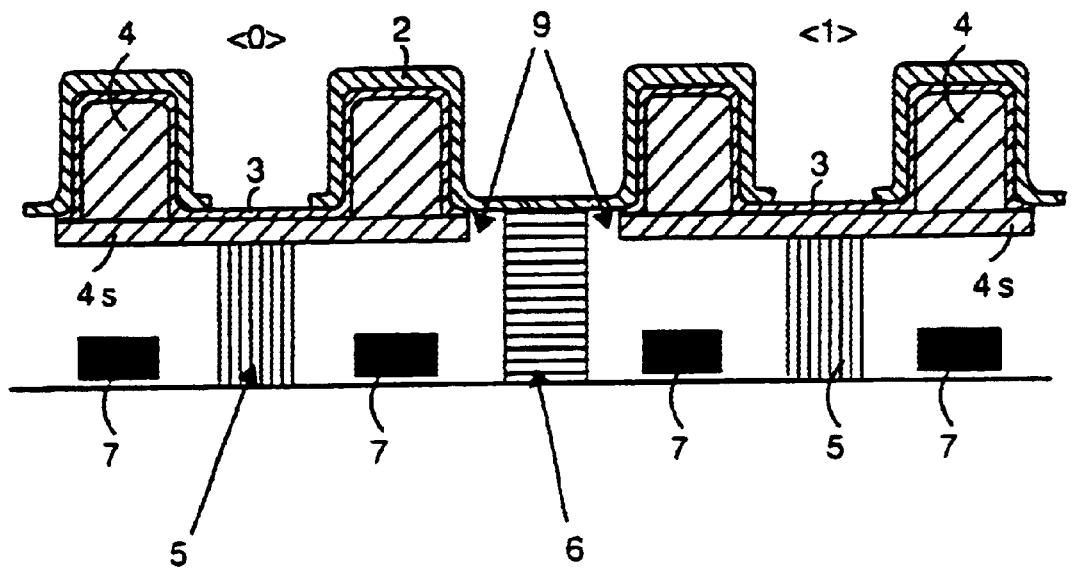
Figure 4C:
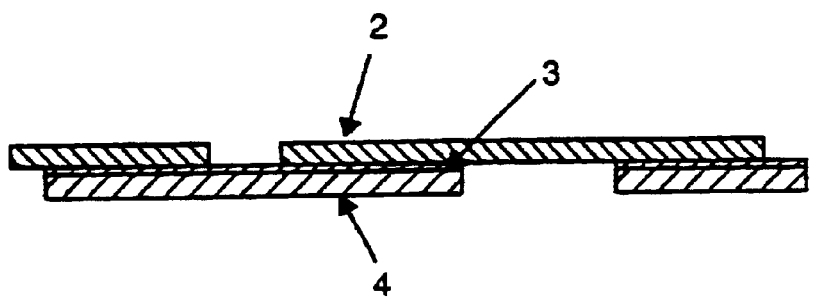
Figure 4D:
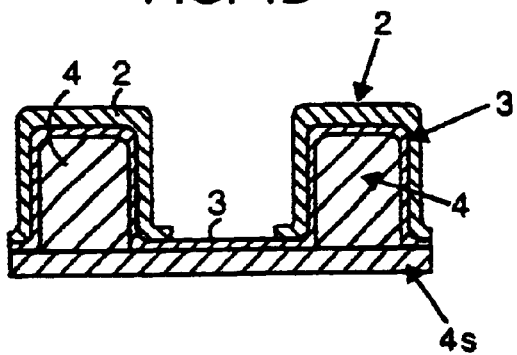

FIGS. 2a, 2b and 2c show two self-adjusting exemplary embodiments of FRAM cells, in which the plan area of each of the memory cells is reduced by 0.5 F in one direction (FIG. 2a). Compared with the larger minimum plan area of the memory area of 10.5 F² achieved in the previous exemplary embodiment, the reduction by 0.5 F in one direction results in the minimum plan area of a cell being reduced to 9 F², that is to say by about 17%.

FIG. 2b shows a cross sectional view of FRAM memory cells 30 and 31 with three-dimensional capacitors. Each of the three dimensional capacitors includes the three-dimensional lower electrode 34s with the stud-like projection 34, a dielectric 33 and an upper capacitor electrode 32. The electrical insulation between the contact plug 36 produced from above according to the invention and the upper electrode 32 and lower electrode 34s is ensured by means of an insulating spacer layer 38. The insulating spacer layer 38 at the same time ensures self-adjustment during adjustment of the contact plug 36 for the upper capacitor electrode 32 from above.

FIG. 2c shows a cross sectional view of ferroelectric memory cells 30a, 31a with three-dimensional capacitors in which the upper electrode 32 and the dielectric 33 overlap the lower electrode 34s in the area, indicated by the reference number 32a, around the contact plug 36, so that the electrical insulation between the upper capacitor electrode 32 and the lower capacitor electrode 34s is achieved by means of the memory dielectric 33 itself. The two embodiments illustrated in FIGS. 2a-2c have the advantage that the lithography for the contact plug 36 is relatively non-critical, since the masking for the etching of the contact hole is not made to be self-adjusting by means of the photoresist, but rather by means of the insulating spacer layer 38 and the structured capacitor electrodes.

In the ferroelectric memory configurations illustrated in FIGS. 2a-2c, the contact plugs 36 for the area of the associated selection transistor located in the substrate are also produced from above as has been described above with reference to FIG. 1.

This means that, in the described exemplary embodiments of the integrated ferroelectric memory configuration, the production process is simplified by means of the specific method for producing the contact plug for the upper electrode of the memory capacitor from above, and there is no need to structure the dielectric before the deposition of the upper electrode. In addition, in the two exemplary embodiments of the invention, illustrated in FIGS. 2a-2c, the self-adjusting etching of the contact hole reduces the cell area by about 17%.

We claim:

1. A method for producing an integrated ferroelectric memory configuration, which comprises:

configuring memory cells using a stacking principle;

for each one of the memory cells, providing a capacitor having two capacitor electrodes located one above another and providing an associated selection transistor located in a substrate below the capacitor;

for each one of the memory cells, providing contact plugs to directly electrically connect the two capacitor electrodes to a source region and a drain region of the associated selection transistor;

producing given ones of the contact plugs from above;

in a first step, for the capacitor of each one of the memory cells, first producing one of the contact plugs for a lower one of the capacitor electrodes and then producing a dielectric;

in a second step, for the capacitor of each one of the memory cells, etching a contact hole from above, through the upper one of the capacitor electrodes and at least through the dielectric as far as a substrate area of the associated selection transistor, the contact hole being for one of the given ones of the contact plugs for contact connecting an upper one of the capacitor electrodes; and in a third step, for the capacitor of each one of the memory cells, producing the one of the given ones of the contact plugs from above by filling the contact hole with a highly conductive metallic material to form an electrically conductive connection between the upper one of the capacitor electrodes and the substrate area of the associated selection transistor.

2. The production method according to claim 1, which comprises:

in the second step, also etching the contact hole through the lower capacitor electrode; and in the third step, before the contact hole is filled with the metallic material, forming an insulating spacing layer on a wall of the contact hole at least around an exposed area of the lower one of the capacitor electrodes to insulate the lower one of the capacitor electrodes from the one of the given ones of the contact plugs.

3. The production method according to claim 1, which comprises:

in the first step, for the capacitor of each one of the memory cells, forming the upper one of the capacitor electrodes and the dielectric to overlap the lower one of the capacitor electrodes in the contact hole such that the dielectric provides electrical insulation between the upper one of the capacitor electrodes and the lower one of the capacitor capacitor electrodes.

* * * * *